(12) United States Patent
Yokoyama et al.

(10) Patent No.: US 8,698,190 B2
(45) Date of Patent: Apr. 15, 2014

(54) LIGHTING DEVICE AND METHOD FOR MANUFACTURING THE SAME

(75) Inventors: Kohei Yokoyama, Kanagawa (JP); Hisao Ikeda, Kanagawa (JP); Shinichi Hirasa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/490,723

(22) Filed: Jun. 7, 2012

(65) Prior Publication Data

US 2012/0313128 A1    Dec. 13, 2012

(30) Foreign Application Priority Data

Jun. 9, 2011   (JP) .................................. 2011-129020

(51) Int. Cl.
*H01L 33/00* (2010.01)
*H01L 21/00* (2006.01)

(52) U.S. Cl.
USPC ................. 257/99; 257/98; 257/100; 438/29; 438/30; 438/39

(58) Field of Classification Search
USPC ...................... 257/98, 99, 100; 438/29, 30, 39
See application file for complete search history.

(56) References Cited

U.S. PATENT DOCUMENTS

| 7,781,967 | B2 | 8/2010 | Hayashi |
| 2008/0054785 | A1* | 3/2008 | Hayashi ........................ 313/483 |
| 2008/0088245 | A1* | 4/2008 | Yamazaki et al. .......... 315/169.3 |
| 2009/0152539 | A1* | 6/2009 | Yamazaki et al. .............. 257/40 |

FOREIGN PATENT DOCUMENTS

| JP | 2003-297558 | 10/2003 |
| JP | 2008-59867 | 3/2008 |
| JP | 2008-71663 | 3/2008 |
| JP | 2009-130132 | 6/2009 |

* cited by examiner

*Primary Examiner* — Fernando L Toledo
*Assistant Examiner* — Karen Kusumakar
(74) *Attorney, Agent, or Firm* — Husch Blackwell LLP

(57) ABSTRACT

A lighting device is formed using a light-emitting element by a more simplified method. The lighting device includes a light-emitting element including a light-emitting layer between a first electrode and a second electrode, a substrate provided with the light-emitting element and an uneven region around the periphery of the light-emitting element, a sealing substrate facing the substrate, connection electrodes connected to the first electrode and the second electrode and formed over the uneven region, and a sealant for bonding the substrate and the sealing substrate. The connection electrodes are each formed using a conductive paste, and the sealant is in contact with the connection electrodes and the uneven region provided around the periphery of the light-emitting element.

15 Claims, 8 Drawing Sheets

LIGHTING DEVICE AND METHOD FOR MANUFACTURING THE SAME

BACKGROUND OF THE INVENTION

1. Field of the Invention

The present invention relates to a lighting device including an organic EL element and a method for manufacturing the lighting device.

2. Description of the Related Art

In recent years, a light-emitting element (also referred to as an organic electroluminescent (EL) element) in which a light-emitting layer containing an organic compound is provided between a pair of electrodes has been actively developed. Lighting has attracted attention as one of application fields of the light-emitting element. This is because an organic. EL element can be thin and light and enables surface emission, which provides features that differ from those of other lighting devices.

Since an organic EL element can be formed in the form of a film, an element with a large area can be easily formed. A variety of researches has been conducted on lighting devices including organic EL elements (e.g., see Patent Document 1).

However, there is a problem in that an organic EL element easily deteriorates owing to moisture, oxygen, or the like existing in the outside air or the like. For example, a non-light-emitting region (so called a dark spot) is caused in a light-emitting region by moisture, oxygen, or the like, and the whole of the organic EL element eventually becomes unable to emit light. Thus, various suggestions have been made for sealing against entry of moisture, oxygen, or the like from the outside air into organic EL elements (e.g., see. Patent Document 2 and Patent Document 3).

There is another problem in that under the present circumstances, the cost for manufacturing a lighting device using an organic EL element is very high. The high manufacturing cost results in a high price of the lighting device, which lowers the competitiveness of the lighting device including an organic EL element even though it has the above-described features different from those of other lighting devices. In order to spread the lighting device including an organic EL element, cost reduction in terms of both a material and a process is needed.

REFERENCES

[Patent Document 1] Japanese Published Patent Application No. 2009-130132
[Patent Document 2] Japanese Published Patent Application No. 2008-059867
[Patent Document 3] Japanese Published Patent Application No. 2008-071663

SUMMARY OF THE INVENTION

Patent. Document 2 discloses a peripheral sealing layer which includes an ultraviolet curable resin and which is used to fix an element substrate provided with an organic EL element and a sealing substrate to each other. An adhesive layer including a thermosetting resin is provided in a portion enclosed by the peripheral sealing layer. An organic buffer layer covering an organic EL layer and a gas barrier layer covering the organic buffer layer are provided under the peripheral sealing layer. Such a sealing structure is proposed in which the organic buffer layer prevents damage to the gas barrier layer and the gas barrier layer prevents entry of moisture or the like from the outside air.

However, the above method needs many steps such as a patterning step and an etching step to form the organic buffer layer and the gas barrier layer in desired regions, which leads to problems such as a considerably large number of steps and a high manufacturing cost.

Further, in Patent Document 3, in order to seal an organic EL element, a structure is proposed in which an element substrate provided with the organic EL element and an uneven adhesion surface of a sealing substrate are bonded to each other through an adhesive (sealant) so that adhesion thereof is increased. Even when such structures are used, they are not sufficient to reduce the entry of moisture or oxygen from the outside.

In view of the above problems, a lighting device is formed using a light-emitting element (organic EL element) by a more simplified method in one embodiment of the present invention. Further, an object of one embodiment of the present invention is to provide a highly reliable lighting device and a method for manufacturing the lighting device by increasing the adhesion of a sealing region of the light-emitting element.

One embodiment of the present invention to solve the above problems is a lighting device in which an uneven region is provided on the periphery of a substrate provided with a light-emitting element, a connection electrode is formed using a conductive paste over the uneven region, and sealing is performed using a sealant through the uneven region and the conductive paste. Details thereof will be described below.

One embodiment of the present invention is a lighting device which includes a light-emitting element including a light-emitting layer between a first electrode and a second electrode, a substrate provided with the light-emitting element and an uneven region around the periphery of the light-emitting element, a sealing substrate facing the substrate, connection electrodes connected to the first electrode and the second electrode and formed over the uneven region, and a sealant for bonding the substrate and the sealing substrate. The connection electrodes are each formed using a conductive paste, and the sealant is in contact with the connection electrodes and the uneven region provided around the periphery of the light-emitting element.

In the above structure, the sealant is in contact with the uneven region formed around the periphery of the light-emitting element and the conductive paste formed over the uneven region; thus, the adhesion area can be increased and the adhesion can be increased. Note that the conductive paste has a rough surface owing to conductive particles included therein, which is very suitable for increasing the adhesion area.

Another embodiment of the present invention is a lighting device which includes a light-emitting element with a light-emitting layer between a first electrode and a second electrode, a substrate provided with the light-emitting element and an uneven region, a sealing substrate facing the substrate, connection electrodes connected to the first electrode and the second electrode and formed over the uneven region, and a sealant for bonding the substrate and the sealing substrate. The connection electrodes are each formed using a conductive paste. The light-emitting element is formed over a planarizing resin formed over the uneven region. The sealant is in contact with the connection electrodes and the uneven region around the periphery of the light-emitting element.

In the above structure, the sealant is in contact with the uneven region around the periphery of the light-emitting element and the conductive paste formed over the uneven region; thus, the adhesion area can be increased and the adhesion can be increased. Note that the conductive paste has a rough surface owing to conductive particles included therein, which is very suitable for increasing the adhesion area. The light-emitting element is formed over the planarizing resin formed over the uneven region. The planarizing resin formed over the uneven region can diffuse light emitted from the light-emitting element, thereby improving the light extraction efficiency of the light-emitting element.

Another embodiment of the present invention is a method for manufacturing a lighting device, which includes the steps of: forming an uneven region in part of substrate; forming a first electrode over a flat portion of the substrate; forming a connection electrode using a conductive paste over the substrate, the uneven region, and the first electrode; forming a partition wall over the first electrode and the connection electrode; forming a light-emitting layer over the first electrode and the partition wall; forming a second electrode over the light-emitting layer, the partition wall, and a connection electrode; applying a sealant to a sealing substrate; and attaching the uneven region and the connection electrodes formed over the uneven region to the sealant to bond the substrate and the sealing substrate.

Another embodiment of the present invention is a method for manufacturing a lighting device, which includes the steps of: forming an uneven region in a substrate; forming a planarizing resin over part of the uneven region; forming a first electrode over the planarizing resin; faulting a connection electrode using a conductive paste over the substrate, the uneven region, the planarizing resin, and the first electrode; forming a partition wall over the first electrode and the connection electrode; forming a light-emitting layer over the first electrode and the partition wall; forming a second electrode over the light-emitting layer, the partition wall, and a connection electrode; applying a sealant to a sealing substrate; and attaching the uneven region and the connection electrodes formed over the uneven region to the sealant to bond the substrate and the sealing substrate.

In each of the above structures, a microlens array substrate may be bonded to the substrate. In addition, the conductive paste preferably contains silver particles formed using a screen printing method.

In the above manufacturing method, a pattern is preferably formed not through a patterning process by photolithography but by an evaporation method with the use of a metal mask, a screen printing method, or the like. By pattern formation without the use of photolithography as described above, the numbers of patterning steps and etching steps can be reduced; thus, a lighting device can be manufactured through a more simplified process. In addition, by reducing patterning steps and etching steps, manufacturing cost can be decreased.

According to the present invention, it is possible to provide a highly reliable lighting device and a method for manufacturing the lighting device by a more simplified method.

DETAILED DESCRIPTION OF THE INVENTION

Figure 1A:
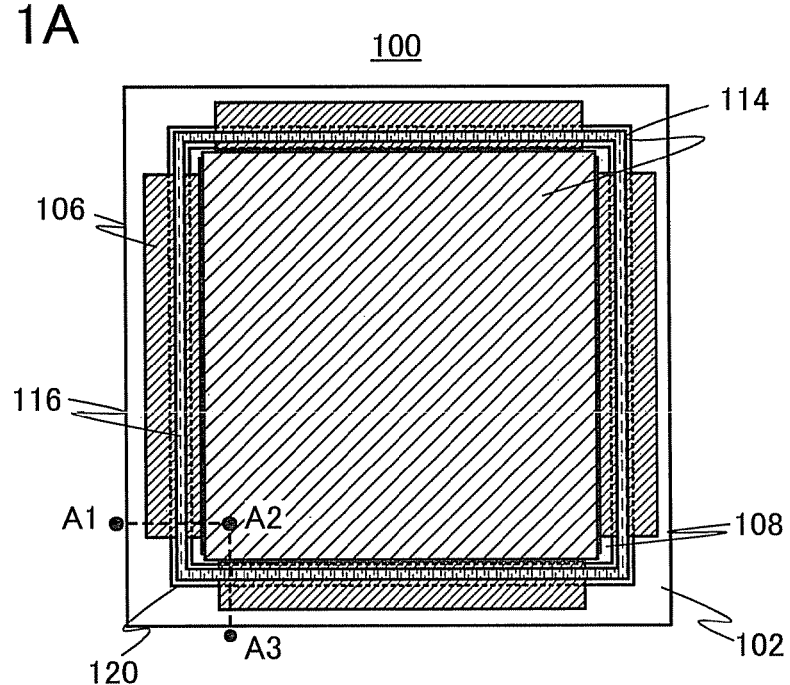
FIGS. 1A to 1C show a lighting device of one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

(Embodiment 1)

Figure 1B:
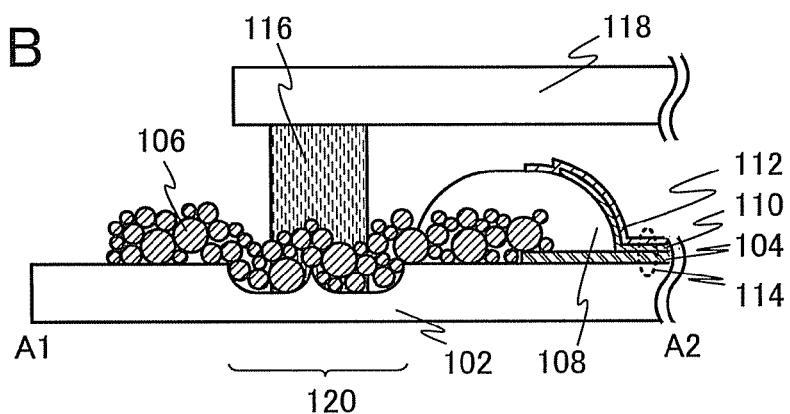
Figure 1C:
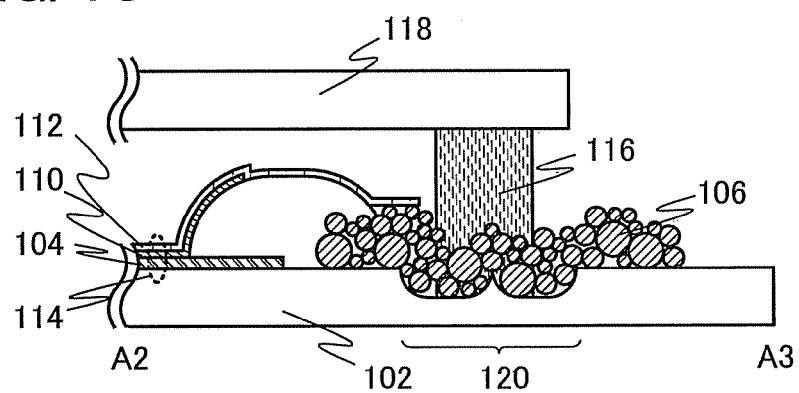

One embodiment of the present invention will be described with reference to FIGS. 1A to 1C. FIG. 1A shows a top view of a lighting device 100. FIG. 1B is a cross-sectional view along the dashed line A1-A2 in FIG. 1A. FIG. 1C is a cross-sectional view along the dashed line A2-A3 in FIG. 1A. Note that in FIG. 1A, some of components (e.g., a sealing substrate 118) are not shown to avoid complexity of the drawing.

The lighting device 100 shown in FIGS. 1A to 1C includes a substrate 102, an uneven region 120 formed in the substrate 102, a first electrode 104 formed over the substrate 102, a connection electrode 106 formed over the substrate 102, the uneven region 120, and the first electrode 104, a partition wall 108 covering the first electrode 104 and the connection electrode 106, a light-emitting layer 110 formed over the first electrode 104 and the partition wall 108, a second electrode 112 formed over the partition wall 108, the light-emitting layer 110, and a connection electrode 106, a sealing substrate 118 provided so as to face the substrate 102, and a sealant 116 for sealing the substrate 102 and the sealing substrate 118.

Note that the lighting device 100 is a bottom emission type lighting device in which light is extracted to the substrate 102 side. For this reason, a light-transmitting material is used for the substrate 102 and the first electrode 104. However, the present invention is not limited to this example. For example, the lighting device 100 may be a top emission type lighting device in which light is extracted to the sealing substrate 118 side or a dual emission type lighting device in which light is extracted to both the substrate 102 side and the sealing substrate 118 side. Note that a light-transmitting material is used on the side to which light is extracted.

Further, the first electrode 104, the light-emitting layer 110, and the second electrode 112 form a light-emitting element 114. In the light-emitting element 114, light can be emitted from the light-emitting layer 110 by applying a voltage between the first electrode 104 and the second electrode 112. Note that the first electrode 104 and the second electrode 112 are connected to the respective connection electrodes 106, so that a voltage is applied between the connection electrode 106 connected to the first electrode 104 and the connection electrode 106 connected to the second electrode 112. That is, the connection electrodes 106 each function as an external input terminal electrode.

The first electrode 104 is a light-transmitting conductive film. However, the resistivity of the light-transmitting conductive film is one or two orders of magnitude higher than that of metal or the like which easily conducts electricity. In the case where the area of the light-emitting element 114 is large, change in luminance in the light-emitting element 114 due to voltage drop is significant. Therefore, the resistance of the connection electrode 106 is preferably lower than that of the first electrode 104. Thus, the first electrode 104 is led to the outside through the connection electrode 106. With such a structure, a voltage can be uniformly supplied to the light-emitting element 114. In addition, the connection electrode 106 also functions as an auxiliary wiring of the first electrode 104. For example, the change in luminance of the light-emitting element 114 due to voltage drop can be further suppressed by employing a structure in which the connection electrode 106 has a planar vertical striped shape, a planar horizontal striped shape, or the like so that a region where the light-emitting element 114 is formed is separated. Thus, it is preferable to employ such a structure. Note that in the case of such a structure, the connection electrode 106 is provided in contact with the first electrode 104 and the partition wall 108 is provided over the connection electrode 106 so that the connection electrode 106 is electrically insulated from the second electrode 112.

Further, the sealant 116 is formed around the periphery of the light-emitting element 114. The sealant 116 is in contact with the uneven region 120 formed in the substrate 102 and the connection electrodes 106 formed over the uneven region 120 so as to bond the substrate 102 and the sealing substrate 118.

Note that a conductive paste formed by a screen printing method or the like can be used for the connection electrodes 106. For example, in the case where a sputtering method or the like is used to form a conductive film in order to form a connection electrode over the uneven region 120, the conductive film may be discontinuous owing to the uneven region 120. However, the conductive paste has excellent fluidity and viscosity, so that conductive particles can enter the uneven region 120 and the connection electrode can also assume the shape of the uneven region 120. In addition, the connection electrode 106 has a rough surface owing to the conductive particles included in the conductive paste, so that the area of the adhesion to the sealant 116 is increased and accordingly the adhesion is increased, which is far preferable. Note that in FIGS. 1B and 1C, the connection electrodes 106 formed by a plurality of conductive particles (with a circular shape in the drawings) are schematically shown.

A sealing region of the sealant 116 is in contact with the uneven region 120 formed in the substrate 102 and the connection electrodes 106 formed over the uneven region 120 in such a manner. With the uneven region 120 and the connection electrodes 106 formed over the uneven region 120, the adhesion area of the sealant 116 is increased, whereby entry of components such as moisture and oxygen from the outside to the inside of the light-emitting element 114 can be suppressed. In addition, the connection electrodes 106 are formed using the conductive paste, so that the surface of the connection electrodes 106 is rough owing to the conductive particles included in the conductive paste. Therefore, an excellent sealing structure can be provided with the use of the uneven region 120 and the connection electrodes 106.

Here, description will be given of a method for manufacturing the lighting device 100 shown in FIGS. 1A to 1C with reference to FIGS. 2A to 2F and FIGS. 3A to 3F.

Figure 2A:
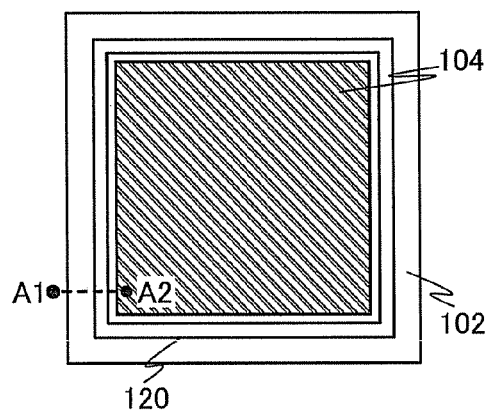
FIGS. 2A to 2F show a method for manufacturing a lighting device of one embodiment of the present invention.
Figure 2B:
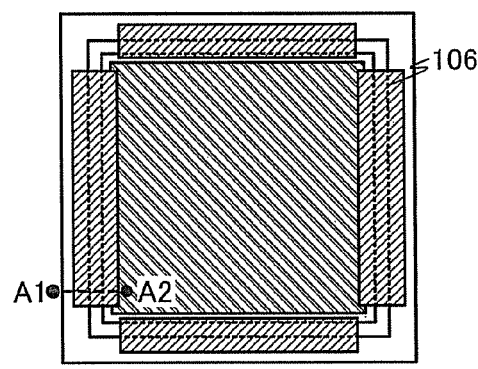
Figure 2C:
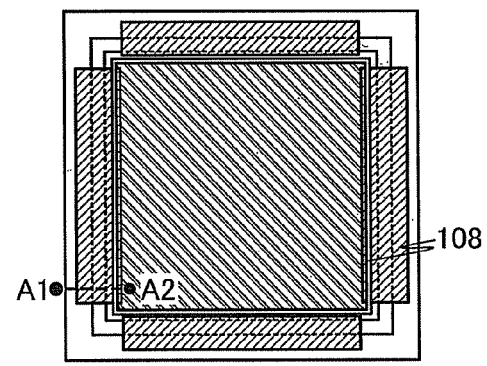
Figure 2D:
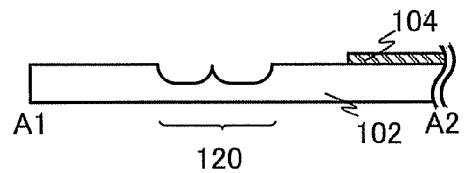
Figure 2E:
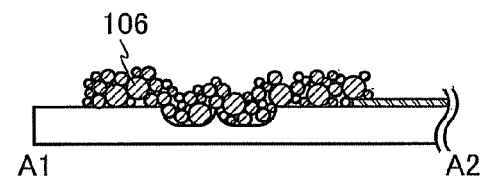
Figure 2F:
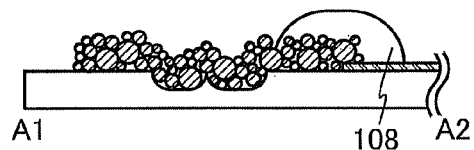
Figure 3A:
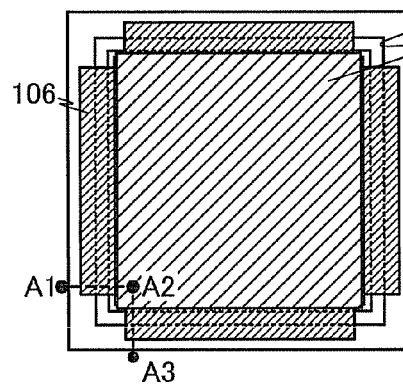
FIGS. 3A to 3F show a method for manufacturing a lighting device of one embodiment of the present invention.
Figure 3C:
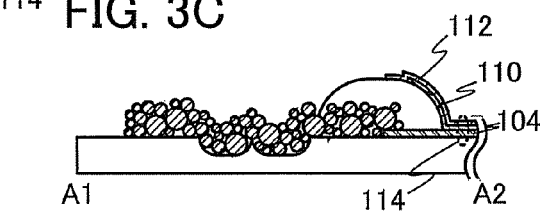
Figure 3D:
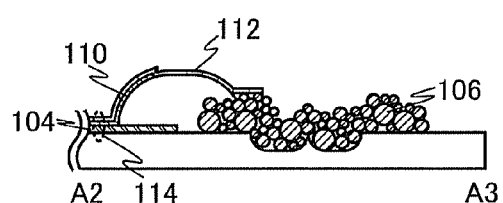
Figure 3B:
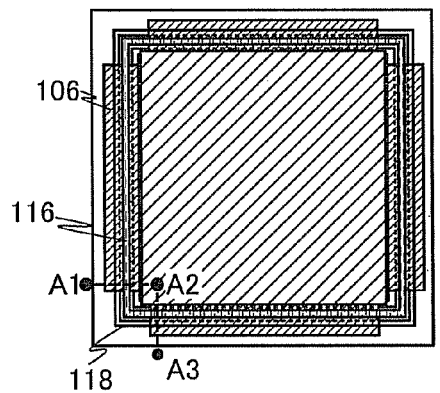
Figure 3E:
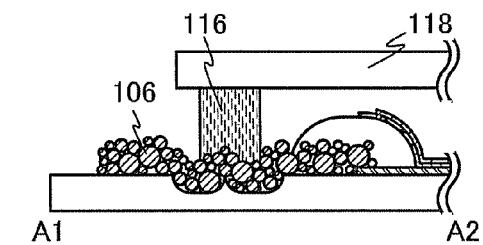
Figure 3F:
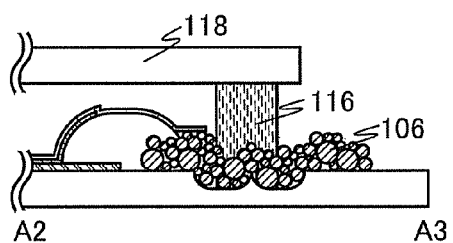

FIGS. 2A to 2C are top views of the lighting device 100. FIGS. 2D, 2E, and 2F are cross-sectional views along dashed lines A1-A2 in FIGS. 2A, 2B, and 2C, respectively. FIGS. 3A and 3B are top views of the lighting device 100. FIGS. 3C and 3E are cross-sectional views along dashed lines A1-A2 in FIGS. 3A and 3B, respectively. FIGS. 3D and 3F are cross-sectional views along dashed lines A2-A3 in FIGS. 3A and 3B, respectively. Note that in FIGS. 2A to 2F, cross-sectional views along the dashed lines A2-A3 are omitted.

First, the uneven region 120 is formed in the substrate 102. The uneven region 120 can be formed as a depressed portion (or a groove) by shotblasting, sandblasting, or chemical etching of a desired region, for example, and has an uneven surface on the depressed portion. Note that in this embodiment, the uneven region 120 is formed around a peripheral region of the light-emitting element 114 (faulted in a later step). Next, the first electrode 104 is formed within the uneven region 120 of the substrate 102 (see FIGS. 2A and 2D).

A light-transmitting material such as a glass substrate, a quartz substrate, an organic resin, or a plastic substrate can be used as the substrate 102. In the case of using an organic resin for the substrate 102, examples of the organic resin include a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefm resin, a polystyrene resin, a polyamide imide resin, a polyvinylchloride resin, and the like. Further, a substrate in which a glass fiber is impregnated with an organic resin or a substrate in which an inorganic filler is mixed with an organic resin can also be used.

Further, a base insulating film may be formed between the substrate 102 and the first electrode 104. A film functioning as a passivation film which prevents diffusion of an impurity such as moisture or oxygen from the substrate 102 can be formed as the base insulating film. A deposition method such as a sputtering method or a CVD method, a coating method such as a dipping method, a spin coating method, or an inkjet method, a printing method such as a screen printing method, or the like can be used as appropriate for the base insulating film depending on its material.

As the first electrode 104, a light-transmitting conductive film is formed by a film formation method such as a sputtering method. In the sputtering, the light-transmitting conductive film can be formed in a desired region with the use of a metal mask (also referred to as a shadow mask). Examples of materials that can be used for the first electrode 104 include indium oxide, indium oxide-tin oxide (ITO), indium oxide-zinc oxide, zinc oxide, zinc oxide to which gallium is added, graphene, and the like.

Alternatively, for the first electrode 104, a metal material such as gold, silver, platinum, magnesium, nickel, tungsten, chromium, molybdenum, iron, cobalt, copper, palladium, or titanium, or an alloy of any of these metal materials can be used. Further alternatively, a nitride of the metal material (e.g., titanium nitride) or the like may be-used. In the case of using the metal material (or the nitride thereof), the first electrode 104 may be thinned so as to be able to transmit light.

Further, a stacked film of any of the above materials can be used as the first electrode 104. For example, a stacked film of ITO and an alloy of silver and magnesium is preferably used, in which case conductivity can be increased.

The first electrode 104 can also be formed in such a manner that a light-transmitting conductive film is formed over the entire surface of the substrate 102, and then an unnecessary portion of the light-transmitting conductive film is removed by a known patterning technique such as a photolithography method. Note that a metal mask is preferably used in the sputtering so that the light-transmitting conductive film is formed in a desired region as described above. A lighting device can be manufactured through a more simplified method when a pattern is formed not through a patterning process by photolithography but by an evaporation method with the use of a metal mask, a screen printing method, or the like in the above manner.

Next, the connection electrode 106 is formed over the substrate 102, the first electrode 104, and the uneven region 120 (see FIGS. 2B and 2E).

A conductive paste that can be fruited by a screen printing method, an inkjet method, or the like is used for the connection electrode 106. In particular, a silver paste including silver particles as a filler or a copper paste including copper particles as a filler is preferably used as the conductive paste. The resistivity of the silver paste or the copper paste can be lower than that of the first electrode 104, whereby voltage drop can be suppressed.

Next, the partition wall 108 is formed over the first electrode 104 and the connection electrode 106 (see FIGS. 2C and 2F).

The partition wall 108 covers edge portions of the first electrode 104 and the connection electrode 106. That is, the partition wall 108 is provided to prevent a disconnection of the light-emitting layer 110 (formed later) at a step in the edge portions and a short circuit between the first electrode 104 and the second electrode 112 at the step in the edge portions. Note that the partition wall 108 is not provided if not needed.

For the partition wall 108, a photosensitive resin is formed by a printing method or an inkjet method. For example, an organic resin such as a polyimide resin, an acrylic resin, a polyamide resin, or an epoxy resin or an inorganic insulating material can be used. It is particularly preferable that the partition wall 108 be formed using a photosensitive resin material to have an opening so that a sidewall of the opening is formed as an inclined surface with continuous curvature. Specifically, the radius of curvature of a curve drawn by a cross section of the partition wall 108 is desirably approximately 0.2 μm to 2 μm. Although there is no particular limitation on a method of forming the partition wall 108, a sputtering method, an evaporation method, a printing method such as a screen printing method or an offset printing method, a droplet discharge method such as an inkjet method or a dispensing method, a coating method such as a slit coating method or a spin coating method, or the like can be used.

Next, the light-emitting layer 110 is formed over the first electrode 104 and the partition wall 108 and then, the second electrode 112 is formed over the partition wall 108, the light-emitting layer 110, and the connection electrode 106. The first electrode 104, the light-emitting layer 110, and the second electrode 112 form the light-emitting element 114 (see FIGS. 3A, 3C, and 3D).

In this embodiment, after the light-emitting layer 110 is formed by an evaporation method, the second electrode 112 is Mimed by an evaporation method over a region overlapping with the partition wall 108, the light-emitting layer 110, and the connection electrode 106. Note that metal masks are used to form the light-emitting layer 110 and the second electrode 112 in desired regions.

The light-emitting layer 110 includes at least a layer containing a light-emitting organic compound. In addition, the light-emitting layer 110 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

The second electrode 112 is formed using a reflective material. As the reflective material, a metal or an alloy containing a metal material such as aluminum, gold, platinum, silver, nickel, tungsten, chromium, molybdenum, iron, cobalt, copper, lanthanum, or palladium can be used. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper or an alloy of silver and magnesium can be used. The alloy of silver and copper is preferable because it has high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

Further, after the second electrode 112 is formed, solid sealing or the like may be performed with a protective film covering the light-emitting element 114 and a sheet-like sealant. Solid sealing prevents entry of an impurity such as moisture or oxygen to the light-emitting element 114; thus, the lighting device can have high reliability.

Through the above steps, the light-emitting element 114 can be formed over the substrate 102.

Next, the substrate 102 provided with the light-emitting element 114 is bonded to the sealing substrate 118 with the use of the sealant 116 so as to face each other (see FIGS. 3B, 3E, and 3F).

A drying agent or an adsorbent is preferably included in a space between the light-emitting element 114 and the sealing substrate 118. The drying agent or the adsorbent reduces an impurity such as moisture or oxygen inside the sealed region, which leads to suppression of deterioration of the light-emitting element 114; consequently, the lighting device can have high reliability.

The sealant 116 is provided around the periphery of the light-emitting element 114 and is in contact with the uneven region 120 formed in the substrate 102 and the connection electrodes 106 formed over the uneven region 120.

The sealant 116 can be formed by, for example, a printing method such as screen printing or a coating method such as a dispensing method. A known material can be used for the sealant 116. For example, a thermosetting resin material, an ultraviolet curable resin material, or a low melting point glass material (frit glass) may be used. A two-component type epoxy resin or the like can also be used. Further, it is desirable that a material used for the sealant do not transmit moisture or oxygen as much as possible. A drying agent may be contained in the sealant. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent.

In this embodiment, the sealant 116 is applied onto the sealing substrate 118 side and the sealing substrate 118 is bonded to the substrate 102. Note that the present invention is not limited to this example, and the sealant 116 may be fainted on the substrate 102 side.

As a method for bonding the substrates, first, the sealant 116 is applied to the sealing substrate 118. Next, the sealing substrate 118 and the substrate 102 are aligned, and the sealant 116 is attached to the uneven region 120 formed in the substrate 102 and the connection electrodes 106 formed over the uneven region 120. Then, the substrate 102 and the sealing substrate 118 are bonded to each other while pressure is applied, and the sealant 116 is cured by irradiation with heat or ultraviolet light.

The bonding step is performed in a reduced-pressure atmosphere or an inert atmosphere, preferably in an atmosphere where an impurity such as water or oxygen is reduced as much as possible. Through the bonding in such an atmosphere, an impurity such as water or oxygen, which is contained in a space between the substrate 102 and the sealing substrate 118, can be reduced, so that the highly reliable lighting device 100 can be manufactured. The sealant 116 is cured by the bonding step, and consequently the substrate 102 and the sealing substrate 118 are bonded to each other with the sealant 116.

For the sealing substrate 118, a material similar to that of the substrate 102 can be used. Note that since the sealing substrate 118 does not need to be able to transmit light, a substrate having high thermal conductivity such as a metal substrate is preferably used. A large lighting device including the light-emitting element 114 might have a problem of heat generation from the light-emitting element 114, and the use of such a substrate having high thermal conductivity can enhance dissipation of the heat. For example, the use of a stainless steel substrate, a substrate of aluminum oxide or duralumin, or the like can promote a reduction in weight and an increase in thermal dissipation.

Further, a region of the sealing substrate 118 where the sealant 116 is formed may have a structure similar to that of a region of the substrate 102 where the sealant 116 is formed. That is, an uneven region and a conductive paste may be formed on the sealing substrate 118 side.

Through the above steps, the lighting device. 100 shown in FIGS. 1A to 1C can be formed. A lighting device can be manufactured through a more simplified method when a pattern is formed not through a patterning process by photolithography but by an evaporation method with the use of a metal mask, a screen printing method, or the like in the above manner.

In a sealing region, the sealant 116 is in contact with the uneven region 120 formed in the substrate 102 and the connection electrodes 106 formed over the uneven region 120. Being in contact with the uneven region 120 formed around the periphery of the light-emitting element 114 and the connection electrodes 106 fanned over the uneven region 120 in such a manner, the sealant 116 can increase the adhesion area and improve adhesion. Note that since the connection electrodes 106 are formed using a conductive paste, the connection electrodes 106 have a rough surface owing to conductive particles included in the conductive paste, whereby the adhesion area can be increased, resulting in an excellent sealing structure.

This embodiment can be implemented in an appropriate combination with any of the other embodiments.

(Embodiment 2)

In this embodiment, an embodiment different from the lighting device 100 described in Embodiment 1 will be described with reference to FIGS. 4A to 4C. Note that the same reference numerals are used for the same parts as those in FIGS. 1A to 1C, and description thereof will not be repeated.

Figure 4A:
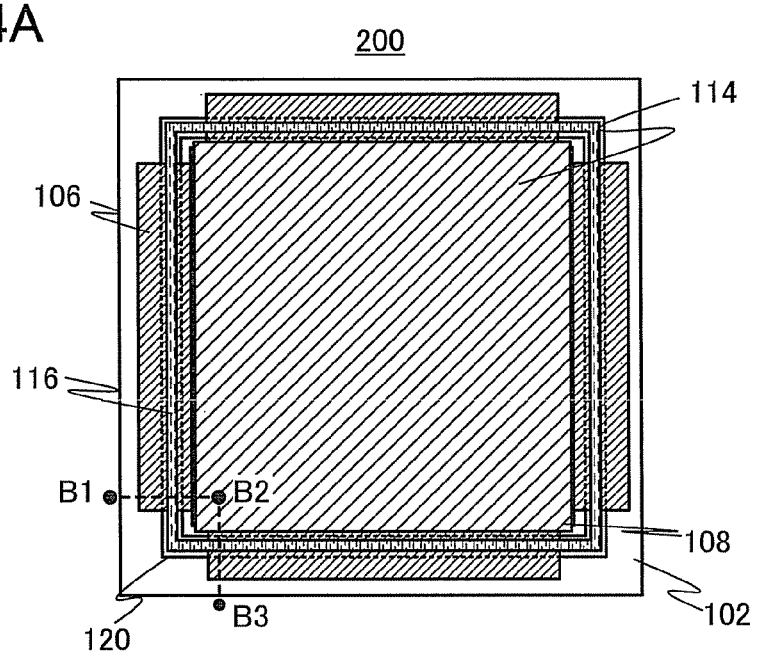
FIGS. 4A to 4C show a lighting device of one embodiment of the present invention.

FIG. 4A shows a top view of a lighting device 200. FIG. 4B is a cross-sectional view along the dashed line B1-B2 in FIG. 4A. FIG. 4C is a cross-sectional view along the dashed line B2-B3 in FIG. 4A. Note that in FIG. 4A, some of components (e.g., the sealing substrate 118) are not shown to avoid complexity of the drawing.

Figure 4B:
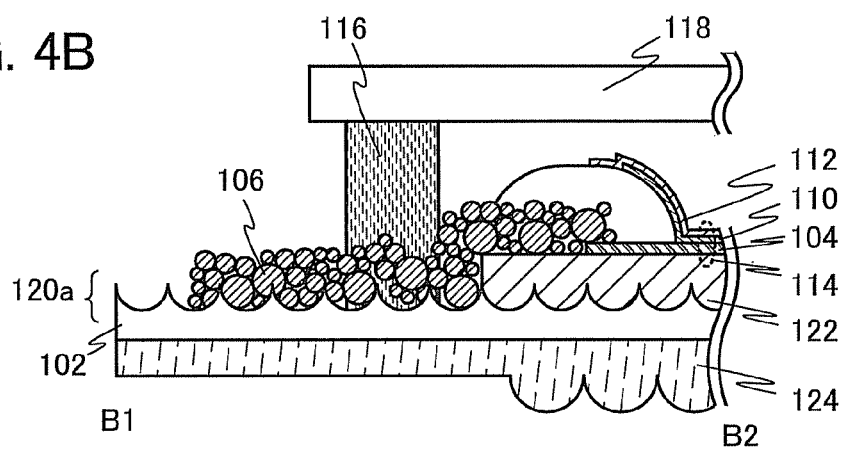
Figure 4C:
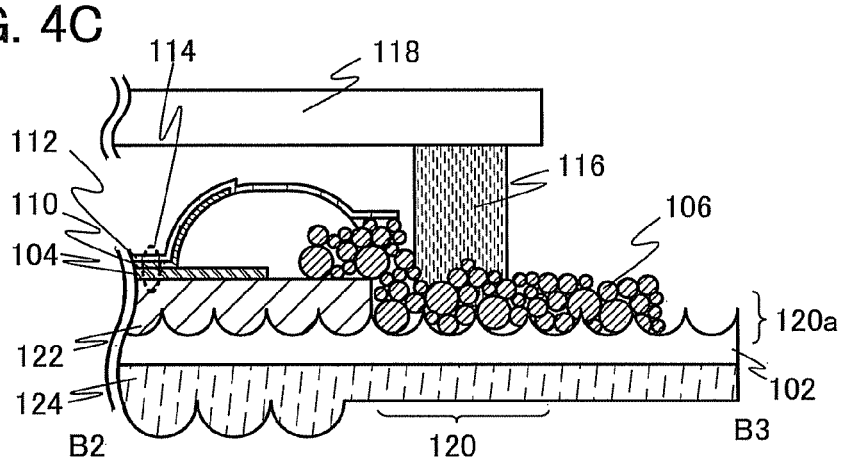

The lighting device 200 shown in FIGS. 4A to 4C includes the substrate 102, a microlens array substrate 124, an uneven region 120a formed in the substrate 102, a planarizing resin 122 formed over the substrate 102, the first electrode 104 formed over the planarizing resin 122, the connection electrode 106 formed over the substrate 102, the planarizing resin 122, and the first electrode 104, the partition wall 108 covering the first electrode 104 and the connection electrode 106, the light-emitting layer 110 formed over the first electrode 104 and the partition wall 108, the second electrode 112 formed over the partition wall 108, the light-emitting layer 110, and the connection electrode 106, the sealing substrate 118 provided so as to face the substrate 102, and the sealant 116 for sealing the substrate 102 and the sealing substrate 118.

Note that the lighting device 200 is a bottom emission type lighting device in which light is extracted to the substrate 102 side. For this reason, a light-transmitting material is used for the microlens array substrate 124, the substrate 102, the planarizing resin 122, and the first electrode 104.

Further, the first electrode 104, the light-emitting layer 110, and the second electrode 112 form the light-emitting element 114. In the light-emitting element 114, light can be emitted from the light-emitting layer 110 by applying a voltage between the first electrode 104 and the second electrode 112. Note that the first electrode 104 and the second electrode 112 are connected to the respective connection electrodes 106, so that a voltage is applied between the connection electrode 106 connected to the first electrode 104 and the connection electrode 106 connected to the second electrode 112. That is, the connection electrodes 106 each function as an external input terminal electrode.

The first electrode 104 is a light-transmitting conductive film. However, the resistivity of the light-transmitting conductive film is one or two orders of magnitude higher than that of metal or the like which easily conducts electricity. In the case where the area of the light-emitting element 114 is large, change in luminance in the light-emitting element 114 due to voltage drop is significant. Therefore, the resistance of the connection electrode 106 is preferably lower than that of the first electrode 104. Thus, the first electrode 104 is led to the outside through the connection electrode 106. With such a structure, a voltage can be uniformly supplied to the light-emitting element 114. In addition, the connection electrode 106 also functions as an auxiliary wiring of the first electrode 104. For example, the change in luminance of the light-emitting element 114 due to voltage drop can be further suppressed by employing a structure in which the connection electrode 106 has a planar vertical striped shape, a planar horizontal striped shape, or the like so that a region where the light-emitting element 114 is formed is separated. Thus, it is preferable to employ such a structure. Note that in the case of such a structure, the connection electrode 106 is provided in contact with the first electrode 104 and the partition wall 108 is provided over the connection electrode 106 so that the connection electrode 106 is electrically insulated from the second electrode 112.

Further, the sealant 116 is formed around the periphery of the light-emitting element 114. The sealant 116 is in contact with the uneven region 120a formed in the substrate 102 and the connection electrodes 106 formed over the uneven region 120a so as to bond the substrate 102 and the sealing substrate 118.

Note that a conductive paste formed by a screen printing method or the like can be used for the connection electrodes 106. For example, in the case where a sputtering method or the like is used to form a conductive film in order to form a connection electrode over the uneven region 120a, the conductive film may be discontinuous owing to the uneven region 120a. However, the conductive paste has excellent fluidity and viscosity, so that conductive particles can enter the uneven region 120a and the connection electrode can also assume the shape of the uneven region 120a. In addition, the connection electrodes 106 have a rough surface owing to the conductive particles included in the conductive paste, which is far preferable. Note that in FIGS. 4B and 4C, the connection electrodes 106 formed by a plurality of conductive particles (with a circular shape in the drawings) are schematically shown.

Note that the lighting device 200 described in this embodiment is different from the lighting device 100 described in Embodiment 1 in that the uneven region 120a formed in the substrate 102, the planarizing resin 122, and the microlens array substrate 124 are provided.

The uneven region 120a formed in the substrate 102 can be formed in a manner similar to that of the uneven region 120 described in Embodiment 1. Note that the uneven region 120a is provided on one entire surface of the substrate 102.

Note that a region of the substrate 102 which is in contact with the sealant 116 has a rough surface owing to the uneven region 120a, which is provided to increase the surface area. This has the same effect as that in the lighting device 100 described in Embodiment 1. On the other hand, the uneven region 120a provided under the light-emitting element 114 has an effect of diffusing light emitted from the light-emitting element 114.

The planarizing resin 122 is formed over the uneven region 120a provided under the light-emitting element 114. The refractive index of the planarizing resin 122 is preferably higher than that of the light-emitting layer 110, for example, equal to 1.6 to 2.0, more preferably 1.7 to 1.9. Such a structure prevents total reflection of light extracted from the light-emitting element 114 at the interface with the planarizing resin 122 and enables the light to enter the planarizing resin 122. The uneven region 120a formed in the substrate 102 prevents total reflection of light having entered the planarizing resin 122 at a lower interface of the planarizing resin 122, so that the light enters the microlens array substrate 124.

The planarizing resin 122 can be formed as a planarizing layer using a polyimide resin, a polyamide resin, a polyimide amide resin, an acrylic resin, benzocyclobutene (BCB), or the like by a screen printing method or the like, for example.

The microlens array substrate 124 here has a plurality of projections, for example. A structure with a plurality of projections can prevent total reflection at the interface between the substrate 102 and the air, resulting in an increase in the efficiency of light extraction from the light-emitting element 114.

The microlens array substrate 124 can be formed using an organic resin as its material. The shape of the organic resin can be processed by heat treatment or light irradiation treatment depending on characteristics of the organic resin. For example, the microlens array substrate 124 can be formed in such a manner that a thermoplastic organic resin is used as a material, a support having depressions is prepared, the organic resin is pressed against the support while being heated so that the organic resin is changed to assume the shape of the support, and then the resin is cooled and cured.

A plastic is given as an organic resin that can be used for the microlens array substrate 124. As an example of plastic, a member made from polycarbonate, polyarylate, polyethersulfone, or the like can be given.

Figure 5A:
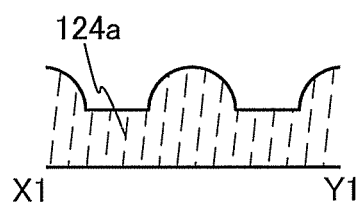
FIGS. 5A to 5D show microlens array substrates each used in a lighting device of one embodiment of the present invention.
Figure 5C:
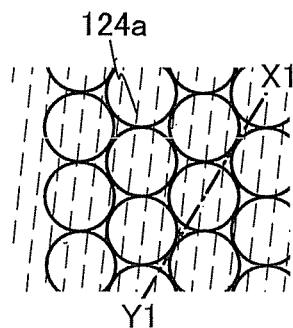
Figure 5B:
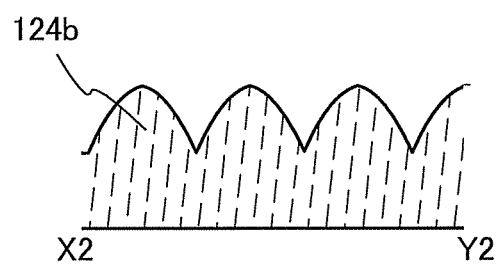
Figure 5D:
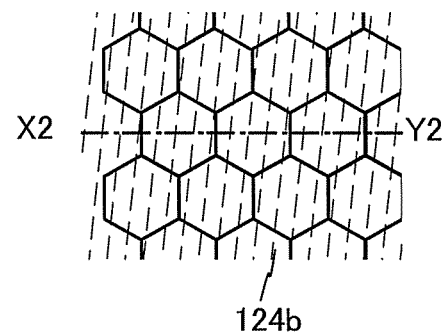

Examples of the microlens array substrate 124 shown in FIGS. 4A to 4C will be described with reference to FIGS. 5A to 5D. FIG. 5C is an example of a plan view of a microlens array substrate 124a, and FIG. 5D is an example of a plan view of a microlens array substrate 124b. FIG. 5A is a cross-sectional view along the dashed line X1-Y1 in FIG. 5C, and FIG. 5B is a cross-sectional view along the dashed line X2-Y2 in FIG. 5D.

The microlens array substrate 124a shown in FIGS. 5A and 5C has hemispherical projections. The microlens array substrate 124b shown in FIGS. 5B and 5D has projections with regular hexagonal bases. The pitch and the bottom shape of the plurality of projections of each of the microlens array substrates 124a and 124b can be set variously and not limited to the structures shown in FIGS. 5A to 5D. For example, a projection with an apex such as a circular cone or a pyramid (e.g., a triangular pyramid or a quadrangular pyramid) may be employed. Note that it is preferable to employ a so-called honeycomb structure including projections with regular hexagonal bases as shown in FIGS. 5B and 5D because the density of arrangement of the projections can be improved and the efficiency of light extraction to the outside can be further improved.

As described above, the lighting device 200 described in this embodiment has the uneven region 120a; thus, both the sealing region of the sealant 116 and a structure having an effect of diffusing light from the light-emitting element 114 can be formed.

In the sealing region, the sealant 116 is in contact with the uneven region 120a formed in the substrate 102 and the connection electrodes 106 formed over the uneven region 120a. Being in contact with the uneven region 120a formed around the periphery of the light-emitting element 114 and the connection electrodes 106 formed over the uneven region 120a in such a manner, the sealant 116 can increase the adhesion area and improve adhesion. Note that since the connection electrodes 106 are formed using a conductive paste, the connection electrodes 106 have a rough surface owing to conductive particles included in the conductive paste, whereby the adhesion area can be increased, resulting in an excellent sealing structure.

This embodiment can be implemented in an appropriate combination with any of the other embodiments.

(Embodiment 3)

In this embodiment, an example of an element structure of a light-emitting element exhibiting organic EL emission which is used in the lighting device of one embodiment of the present invention will be described. The light-emitting element exhibiting the organic EL emission generates a smaller amount of heat than an LED. Thus, an organic resin can be used for a housing, so that a reduction in weight of the lighting device is possible, which is preferable.

Figure 6A:
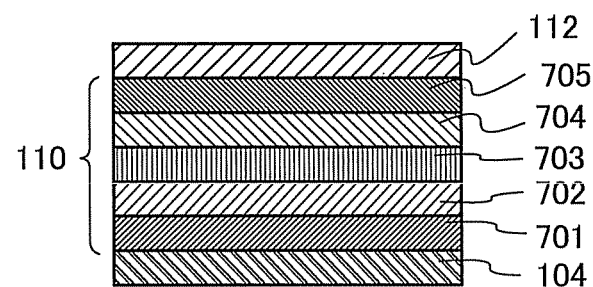
FIGS. 6A to 6C each show a light-emitting element used in a lighting device of one embodiment of the present invention.

A light-emitting element illustrated in FIG. 6A includes a first electrode 104, a light-emitting layer 110 over the first electrode 104, and a second electrode 112 over the light-emitting layer 110.

The light-emitting layer 110 includes at least a light-emitting layer containing a light-emitting organic compound. In addition, the light-emitting layer 110 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, a hole-injection layer 701, a hole-transport layer 702, a light-emitting layer 703, an electron-transport layer 704, and an electron-injection layer 705 are stacked in this order from the first electrode 104 side in the light-emitting layer 110.

A method for manufacturing the light-emitting element illustrated in FIG. 6A will be described.

First, the first electrode 104 is formed. The first electrode 104 is provided in the direction in which light is extracted from the light-emitting layer 110, and thus is formed using a light-transmitting material.

As the light-transmitting material, indium oxide, indium oxide-tin oxide (also referred to as ITO), indium oxide-zinc oxide, zinc oxide, zinc oxide to which gallium is added, graphene, or the like can be used.

Alternatively, for the first electrode 104, a metal material such as gold, platinum, nickel, tungsten, chromium, molybdenum, iron, cobalt, copper, palladium, or titanium can be used. Further alternatively, a nitride of the metal material (e.g., titanium nitride) or the like may be used. In the case of using the metal material (or the nitride thereof), the first electrode 104 may be thinned so as to be able to transmit light.

Next, the light-emitting layer 110 is formed over the first electrode 104. In this embodiment, the light-emitting layer 110 includes the hole-injection layer 701, the hole-transport layer 702, the light-emitting layer 703, the electron-transport layer 704, and the electron-injection layer 705.

The hole-injection layer 701 is a layer containing a substance having a high hole-injection property. Examples of the substance having a high hole-injection property which can be used are metal oxides, such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide. Other examples of the substance which can be used are phthalocyanine-based compounds, such as phthalocyanine (abbreviation: $H_2Pc$) and copper(II) phthalocyanine (abbreviation: CuPc).

Other examples of the substance which can be used are aromatic amine compounds which are low molecular organic compounds, such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN 1).

Still other examples of the substance which can be used are high molecular compounds (e.g., oligomers, dendrimers, and polymers), such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD), and high molecular compounds to which acid is added, such as poly(3,4-ethylenedioxythiophene)/poly(styrenesulfonic acid) (PEDOT/PSS), or polyaniline/poly(styrenesulfonic acid) (PAni/PSS).

In particular, as the hole-injection layer 701, a composite material in which an organic compound having a high hole-transport property contains an acceptor substance is preferably used. With the use of the composite material in which a substance having a high hole-transport property contains an acceptor substance, an excellent hole-injection property from the first electrode 104 can be obtained, which results in a reduction in drive voltage of the light-emitting element. A composite material of these substances can be formed by co-evaporation of a substance having a high hole-transport property and an acceptor substance. When the hole-injection layer 701 is formed using the composite material, holes are easily injected from the first electrode 104 into the light-emitting layer 110.

Examples of the organic compound used for the composite material can be a variety of compounds, such as aromatic amine compounds, carbazole derivatives, aromatic hydrocarbons, and high molecular compounds (e.g., oligomers, dendrimers, and polymers). The organic compound used for the composite material is preferably an organic compound having a high hole-transport property, and is specifically preferably a substance having a hole mobility of $10^{-6}$ $cm^2/Vs$ or more. Note that other than these substances, any substance that has a property of transporting more holes than electrons may be used. Organic compounds that can be used for the composite material will be specifically described below.

Examples of the organic compound that can be used for the composite material are aromatic amine compounds, such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl) triphenylamine (abbreviation: BPAFLP), and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples of the organic compound that can be used are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds, such as 7,7,8,8-tetracyano-2,3,5,6-tetrafluoroquinodimethane (abbreviation: $F_4$-TCNQ) and chloranil, oxides of transition metals, and oxides of metals that belong to Groups 4 to 8 in the periodic table, and the like. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable since it is stable in the air, has a low hygroscopic property, and is easy to handle.

The composite material may be formed using the above-described electron acceptor and the above-described high molecular compound such as PVK, PVTPA, PTPDMA, or Poly-TPD, and may be used for the hole-injection layer 701.

The hole-transport layer 702 is a layer that contains a substance having a high hole-transport property. Examples of the substance having a high hole-transport property are aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ CM$^2$/Vs or more. Note that other than these substances, any substance that has a property of transporting more holes than electrons may be used. Note that the layer containing a substance having a high hole-transport property is not limited to a single layer, and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can also be used.

The light-emitting layer 703 is a layer that contains a light-emitting organic compound. As the light-emitting organic compound, for example, a fluorescent compound which emits fluorescence or a phosphorescent compound which emits phosphorescence can be used.

Examples of the fluorescent compound that can be used for the light-emitting layer 703 are the following light-emitting materials: materials that emit blue light, such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl) triphenylamine (abbreviation: PCBAPA); materials that emit green light, such as N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation:2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA); materials that emit yellow light, such as rubrene and 5,12-bis(1,1'-biphenyl-4-yl)-6,11-diphenyltetracene (abbreviation: BPT); and materials that emit red light, such as N,N,N,'N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

Examples of the phosphorescent compound that can be used for the light-emitting layer 703 are the following light-emitting materials: materials that emit blue light, such as bis[2-(4',6'-difluorophenyl)pyridinato-N,C$^2$']iridium(III)tetrakis(1-pyrazolyl)borate (abbreviation: FIr6), bis[2-(4',6'-difluorophenyl)pyridinato-N,C$^2$']iridium(III)picolinate (abbreviation: FIrpic), bis{2-[3',5'-bis(trifluoromethyl)phenyl] pyridinato-N,C$^2$'}iridium(III)picolinate (abbreviation: Ir(CF$_3$ppy)$_2$(pic)), and bis[2-(4',6'-difluorophenyl)pyridinato-N,C$^2$']iridium(III)acetylacetonate (abbreviation: FIr(acac)); materials that emit green light, such as tris(2-phenylpyridinato-N,C$^2$')iridium(III) (abbreviation: Ir(ppy)$_3$), bis(2-phenylpyridinato-N,C$^2$')iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h] quinolinato)iridium(III) (abbreviation: Ir(bzq)$_3$); materials that emit yellow light, such as bis(2,4-diphenyl-1,3-oxazolato-N,C$^2$')iridium(III)acetylacetonate (abbreviation: Ir(dpo)$_2$(acac)), bis[2-(4'-perfluorophenylphenyl)pyridinato] iridium(III)acetylacetonate (abbreviation: Ir(p-PF-ph)$_2$ (acac)), bis(2-phenylbenzothiazolato-N,C$^2$')iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$ (acac)), and (acetylacetonato)bis{2-(4-methoxyphenyl)-3,5-dimethylpyrazinato}iridium(III) (abbreviation: Ir(dmmoppr)$_2$(acac)); materials that emit orange light, such as tris(2-phenylquinolinato-N,C$^2$')iridium(III) (abbreviation: Ir(pq)$_3$), bis(2-phenylquinolinato-N,C$^2$')iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)); and materials that emit red light, for example, organometallic complexes, such as bis[2-(2'-benzo [4,5-α]thienyppyridinato-N,C$^3$')iridium(III)acetylacetonate (abbreviation: Ir(btp)$_2$(acac)), bis(1-phenylisoquinolinato-N, C$^2$')iridium(III)acetylacetonate (abbreviation: Ir(piq)$_2$ (acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2, 3,5-triphenylpyrazinato)iridium(III) (abbreviation: Ir(tppr)$_2$ (dpm)), and (2,3,7,8,12,13,17,18-octaethyl-21H,23H-porphyrin)platinum(II) (abbreviation: PtOEP). Any of the following rare earth metal complexes can be used as the phosphorescent compound: tris(acetylacetonato) (monophenanthroline)terbium(III) (abbreviation: Tb(acac)$_3$ (Phen)); tris(1,3-diphenyl-1,3-propanedionato) (monophenanthroline)europium(III) (abbreviation: Eu(DBM)$_3$(Phen)); and tris [1-(2-thenyl)-3,3;3-trifluoroacetonato](monophenanthroline)europium(III) (abbreviation: Eu(TTA)$_3$(Phen)), because their light emission is from rare earth metal ions (electronic transition between different multiplicities) in such a rare earth metal complex.

Note that the light-emitting layer 703 may have a structure in which any of the above-described light-emitting organic compounds (a guest material) is dispersed in another substance (a host material). A variety of substances can be used as the host material, and it is preferable to use a substance having a lowest unoccupied molecular orbital level (LUMO level) higher than that of a light-emitting substance and having a highest occupied molecular orbital level (HOMO level) lower than that of the light-emitting substance.

Specific examples of the host material that can be used are the following materials: metal complexes, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazo lyl)phenolato]zinc(II) (abbreviation: ZnPBO), and bis[2-(2-benzothiazolyl)phenolato]zinc(II) (abbreviation: ZnBTZ); heterocyclic compounds, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds, such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diphenanthrene (abbreviation: DPNS), 9,9'-(stilbene-4,4'-diyl)diphenanthrene (abbreviation: DPN2), 3,3',3"-(benzene-1,3,5-triyl) tripyrene (abbreviation: TPB3), 9,10-diphenylanthracene (abbreviation: DPAnth), and 6,12-dimethoxy-5,11-diphenylchrysene; aromatic amine compounds, such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or a-NPD), TPD, DFLDPBi, and BSPB; and the like.

Plural kinds of host materials can also be used. For example, in order to suppress crystallization, a substance such as rubrene, which suppresses crystallization, may be further added. In addition,. NPB, Alq, or the like may be further added in order to efficiently transfer energy to the guest material.

With a structure in which a guest material is dispersed in a host material, crystallization of the light-emitting layer 703 can be suppressed. In addition, concentration quenching due to high concentration of the guest material can also be suppressed.

For the light-emitting layer 703, a high molecular compound can be used. Specific examples of blue light-emitting materials are poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Specific examples of green light-emitting materials are poly(p-phenylenevinylene) (abbreviation: PPV), poly[(9,9-dihexylfluorene-2,7-diyl)-alt-co-(benzo [2,1,3] thiadiazole-4,7-diyl)] (abbreviation: PFBT), poly [(9,9-dioctyl-2,7-divinylenefluorenylene)-alt-co-(2-methoxy-5-(2-ethylhexyloxy)-1,4-phenylene)], and the like. Specific examples of orange to red light-emitting materials are poly [2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Note that the light-emitting layer may have a stacked-layer structure including two or more layers. When the light-emitting layer has a stacked-layer structure including two or more layers and the kind of light-emitting substance for each light-emitting layer is changed, various emission colors can be obtained. In addition, when a plurality of light-emitting substances which emit light of different colors is used as the light-emitting substance, light emission having a broad spectrum or white light emission can also be obtained. In particular, a lighting device, for which high luminance is necessary, preferably has a structure in which light-emitting layers are stacked.

The electron-transport layer 704 is a layer that contains a substance having a high electron-transport property. Examples of the substance having a high electron-transport property are metal complexes having a quinoline skeleton or a benzoquinoline skeleton, such as tris(8-quinolinolato)aluminum (abbreviation: Alq), tris(4-methyl-8-quinolinolato) aluminum (abbreviation: Almq$_3$), bis(10-hydroxybenzo[h] quinolinato)beryllium (abbreviation: BeBq$_2$), and bis(2-methyl-8-quinolinolato)(4-phenylphenolato)aluminum (abbreviation: BAlq). Other examples are metal complexes having an oxazole-based or thiazole-based ligand, such as bis[2-(2-hydroxyphenyl)benzoxazolato]zinc (abbreviation: Zn(BOX)$_2$) and bis[2-(2-hydroxyphenyl)benzothiazolato] zinc (abbreviation: Zn(BTZ)$_2$). Other than metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances mentioned here are mainly substances having an electron mobility of $10^{-6}$ cm$^2$/Vs or more. Further, the electron-transport layer is not limited to a single layer, and may be a stack of two or more layers containing any of the above substances.

The electron-injection layer 705 is a layer that contains a substance having a high electron-injection property. Examples of the substance that can be used for the electron-injection layer 705 are alkali metals, alkaline earth metals, and compounds thereof, such as lithium, cesium, calcium, lithium fluoride, cesium fluoride, calcium fluoride, and lithium oxide, rare earth metal compounds, such as erbium fluoride, and the above-mentioned substances used for the electron-transport layer 704.

Note that the hole-injection layer 701, the hole-transport layer 702, the light-emitting layer 703, the electron-transport layer 704, and the electron-injection layer 705 which are mentioned above can each be formed by a method, such as an evaporation method (including a vacuum evaporation method), an inkjet method, or a coating method.

Figure 6B:
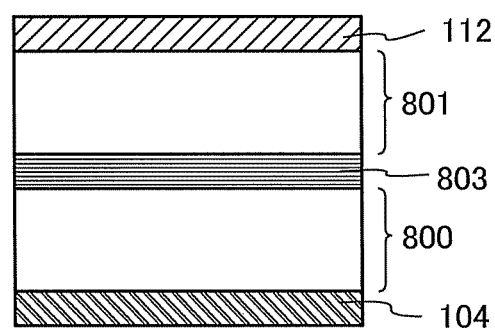

A plurality of light-emitting layers 110 may be stacked between the first electrode 104 and the second electrode 112 as illustrated in FIG. 6B. In that case, a charge-generation layer 803 is preferably provided between a first light-emitting layer 800 and a second, light-emitting layer 801 which are stacked. The charge-generation layer 803 can be formed using the above-described composite material. Further, the charge-generation layer 803 may have a stacked structure including a layer containing the composite material and a layer containing another material. In that case, as the layer containing another material, a layer containing an electron-donating substance and a substance with a high electron-transport property, a layer formed of a transparent conductive film, or the like can be used. As for a light-emitting element having such a structure, problems such as energy transfer and quenching hardly occur, and a light-emitting element which has both high emission efficiency and a long lifetime can be easily obtained due to a wider choice of materials. Moreover, a light-emitting element which provides phosphorescence from one of the light-emitting layers and fluorescence from the other of the light-emitting layers can be readily obtained. This structure can be combined with any of the above-described structures of the light-emitting layer.

When the charge-generation layer 803 is provided between the stacked light-emitting layers as illustrated in FIG. 6B, the element can have high luminance and a long lifetime while the current density is kept low. In addition, the voltage drop due to resistance of the electrode material can be reduced, whereby uniform in light emission over a large area is possible.

In the case of a stacked-type element in which two light-emitting layers are stacked, when the emission colors obtained from the first and second light-emitting layers are complementary to each other, white light emission can be extracted to the outside. Note that white light emission can also be obtained with a structure where each of the first and second light-emitting layers includes a plurality of light-emitting layers emitting light of complementary colors. Examples of complementary colors include blue and yellow, blue-green and red, and the like. A substance which emits light of blue, yellow, blue green, or red may be selected as appropriate from, for example, the light-emitting substances given above.

An example of a light-emitting element having a structure in which a plurality of light-emitting layers is stacked is described below. First, an example of the structure in which each of the first and second light-emitting layers includes a plurality of light-emitting layers emitting light of complementary colors and from which white light emission can be obtained is described.

For example, the first light-emitting layer includes a first light-emission layer that emits light having an emission spectrum with a peak in the blue to blue-green wavelength range, and a second light-emission layer that emits light having an emission spectrum with a peak in the yellow to orange wavelength range; the second light-emitting layer includes a third light-emission layer that emits light having an emission spectrum with a peak in the blue-green to green wavelength range, and a fourth light-emission layer that emits light having an emission spectrum with a peak in the orange to red wavelength range.

In that case, a light emission from the first light-emitting layer is a combination of light emissions from both the first light-emission layer and the second light-emission layer, and thus exhibits an emission spectrum with peaks both in the blue to blue-green wavelength range and in the yellow to orange wavelength range. That is, the first light-emitting layer emits light of two-wavelength type white or a two-wavelength type color close to white.

Further, a light emission from the second light-emitting layer is a combination of light emissions from both the third light-emission layer and the fourth light-emission layer, and thus exhibits an emission spectrum with peaks both in the blue-green to green wavelength range and in the orange to red wavelength range. That is, the second light-emitting layer emits light of two-wavelength type white or a two-wavelength type color close to white, which is different from the light emitted from the first light-emitting layer.

Thus, a combination of the light emissions from the first light-emitting layer and the second light-emitting layer can provide a light emission of white which covers the wavelength ranges of blue to blue-green, blue-green to green, yellow to orange, and orange to red.

Further, the yellow to orange wavelength range (greater than or equal to 560 nm and less than 580 nm) is a wavelength range of high luminosity; thus, application of a light-emitting layer having an emission spectrum peak in the yellow to orange wavelength range is useful. For example, a structure can be used in which a first light-emitting layer which includes a light-emitting layer having an emission spectrum peak in the blue wavelength range, a second light-emitting layer which includes a light-emitting layer having an emission spectrum peak in the yellow wavelength range, and a third light-emitting layer which includes a light-emitting layer having an emission spectrum peak in the red wavelength range are stacked.

Further, two or more light-emitting layers emitting yellow to orange light may be stacked. When two or more light-emitting layers emitting yellow to orange light are stacked, the power efficiency of the light-emitting element can be further improved.

For example, in the case of a light-emitting element in which three light-emitting layers are stacked, a structure can be used in which a second light-emitting layer and a third light-emitting layer each including a light-emitting layer having an emission spectrum peak in the yellow to orange wavelength range are stacked over a first light-emitting layer including a light-emitting layer having an emission spectrum peak in the blue wavelength range (greater than or equal to 400 nm and less than 480 nm). Note that the wavelength of the peak of the emission spectrum from the second light-emitting layer may be the same as or different from that from the third light-emitting layer.

The use of the light-emitting layer emitting light having an emission spectrum peak in the yellow to orange wavelength range makes it possible to utilize a wavelength range of high luminosity and to improve power efficiency. Thus, the power efficiency of the whole light-emitting element can be increased. Such a structure is advantageous in terms of luminosity and can improve power efficiency in comparison with the case where, for example, a light-emitting layer which emits green light and a light-emitting layer which emits red light are stacked to obtain a light-emitting element which emits yellow to orange light. Further, the emission intensity of light in the blue wavelength range of low luminosity is relatively low in comparison with the case where only one light-emitting layer emitting light having a spectrum peak in the yellow to orange wavelength range of high luminosity is used; thus, the color of emitted light is close to incandescent color (or warm white), and the power efficiency is improved.

In other words, in the above light-emitting element, the color of light which is obtained by combining light whose emission spectrum peak is in the yellow to orange wavelength range and whose wavelength at the peak is greater than or equal to 560 nm and less than 580 nm and light whose emission spectrum peak is in the blue wavelength range (i.e., the color of light emitted from the light-emitting element) can be a natural color like warm white or incandescent color. In particular, incandescent color can be easily obtained.

For example, an organometallic complex in which a pyrazine derivative serves as a ligand can be used as the light-emitting substance which emits light having an emission spectrum peak in the yellow to orange wavelength range. Alternatively, the light-emitting layers can be foamed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex, in which a pyrazine derivative serves as a ligand, is a phosphorescent compound, has high emission efficiency, and easily emits light in the yellow to orange wavelength range, and is thus favorable.

For example, a pyrenediamine derivative can be used as the light-emitting substance which emits light having a peak in the blue wavelength range. A fluorescent compound can be used as the light-emitting substance which emits light having a peak in the blue wavelength range. The use of a fluorescent compound makes it possible to obtain a light-emitting element which has longer lifetime than a light-emitting element in which a phosphorescent compound is used. The above pyrenediamine derivative is a fluorescent compound, can have extremely high quantum yield, and has long lifetime, and is thus favorable.

Figure 6C:
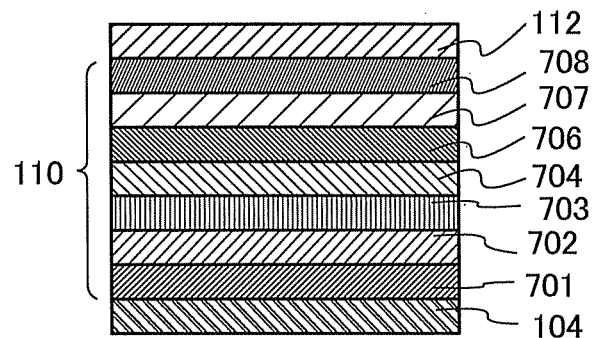

As illustrated in FIG. 6C, the light-emitting layer may include the hole-injection layer 701, the hole-transport layer 702, the light-emitting, layer 703, the electron-transport layer 704, an electron-injection buffer layer 706, an electron-relay layer 707, and a composite material layer 708 which is in contact with the second electrode 112, between the first electrode 104 and the second electrode 112.

It is preferable to provide the composite material layer 708 which is in contact with the second electrode 112, in which case damage caused to the light-emitting layer 110 particularly when the second electrode 112 is formed by a sputtering method can be reduced. The composite material layer 708 can be formed using the above-described composite material in which an organic compound having a high hole-transport property contains an acceptor substance.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

For the electron-injection buffer layer 706, a substance having a high electron-injection property, such as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

Further, in the case where the electron-injection buffer layer 706 contains a substance having a high electron-transport property and a donor substance, the donor substance is preferably added so that the mass ratio of the donor substance to the substance having a high electron-transport property is in the range from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron-transport property, a material similar to the material for the electron-transport layer 704 described above can be used.

Furthermore, it is preferable that the electron-relay layer 707 be formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in drive voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is also controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to $-5.0$ eV, more preferably higher than or equal to $-5.0$ eV and lower than or equal to $-3.0$ eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, specifically, any of CuPc, a phthalocyanine tin(III) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus; electrons can be transferred (donated and accepted) more easily. Further, the metal complex having a metal-oxygen double bond is considered stable. Thus, the use of the metal complex having the metal-oxygen double bond enables the light-emitting element to be driven more stably at low voltage.

As the metal complex having a metal-oxygen bond and an aromatic ligand, a phthalocyanine-based material is preferable. Specifically, any of vanadyl phthalocyanine (VOPc), a phthalocyanine tin(III) oxide complex (SnOPc), and a phthalocyanine titanium oxide complex (TiOPc) is preferable because a metal-oxygen double bond is likely to act on another molecule in terms of a molecular structure and an acceptor property is high.

Note that as the phthalocyanine-based materials mentioned above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent and therefore has the advantage of being easy to handle during formation of a light-emitting element and the advantage of facilitating maintenance of an apparatus used for film formation.

The electron-relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, other than the materials given above as the substance having a high electron-transport property, a substance having a LUMO level higher than the acceptor level of the acceptor substance contained in the composite material layer 708 can be used. Specifically, it is preferable to use a substance having a LUMO level higher than or equal to −5.0 eV, preferably higher than or equal to −5.0 eV and lower than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 707 because of its high stability.

Specific examples of the perylene derivative are 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

Specific examples of the nitrogen-containing condensed aromatic compound are pirazino [2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido [2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracar boxylic diimide (abbreviation: NTCDI-C8F), 3',4'-dibutyl-5,5"-bis(dicyanomethylene)-5,5"-dihydro-2,2':5',2"-terthiophene (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may each be formed using the above-described materials.

Then, the second electrode 112 is formed over the light-emitting layer 110.

The second electrode 112 is provided on the side opposite to the light extraction side and is formed using a reflective material. As the reflective material, a metal material such as aluminum, gold, platinum, silver, nickel, tungsten, chromium, molybdenum, iron, cobalt, copper, or palladium can be used. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. The alloy of silver and copper is preferable because it has high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given. The above materials are preferable because they are present in large amounts in the Earth's crust and inexpensive and thus a reduction in the cost of manufacturing a light-emitting element can be achieved.

Note that this embodiment can be combined with any of the other embodiments as appropriate.

(Embodiment 4)

In this embodiment, application examples of a lighting device will be described.

Figure 7:
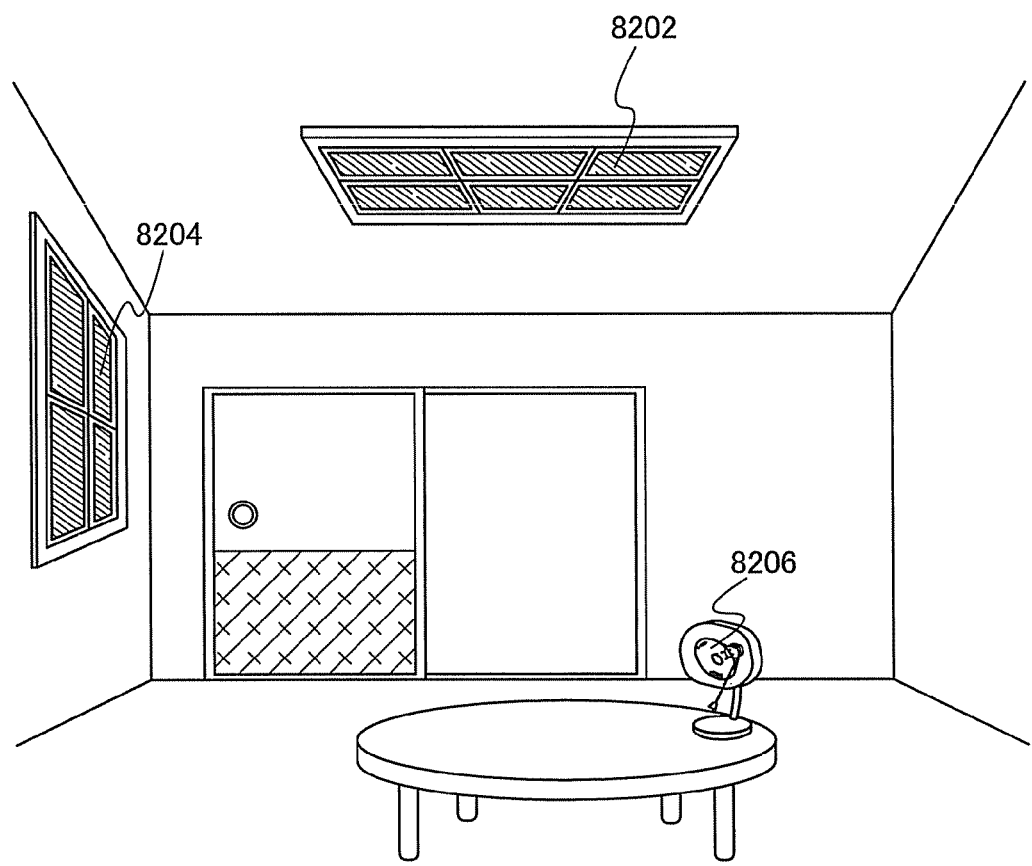
FIG. 7 shows lighting devices of one embodiment of the present invention.

FIG. 7 illustrates an example in which the lighting device according to one embodiment of the present invention is used as an indoor lighting device. The lighting device according to one embodiment of the present invention can be used not only as a ceiling-mounted lighting device 8202 but also as a wall-mounted lighting device 8204. The lighting device can also be used as a desk lighting device 8206. The lighting device according to one embodiment of the present invention, which has a planar light source, is preferably used as an indoor lighting device because it has advantages such as a reduction in number of components such as a light-reflecting plate as compared with the case of using a point light source, or less heat generation as compared with a filament bulb.

Next, examples in which the lighting device according to one embodiment of the present invention is applied to lighting devices such as a guide light are illustrated in FIGS. 8A to 8D.

Figure 8A:
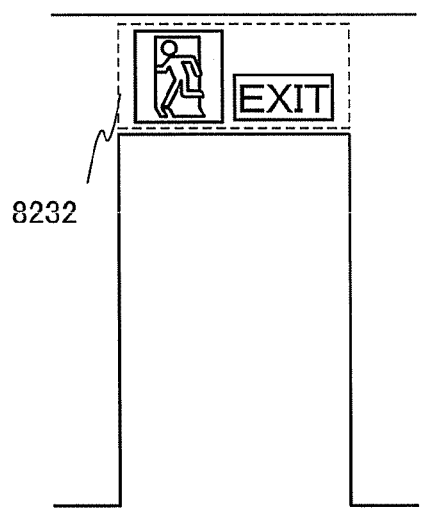
FIGS. 8A to 8D each show a lighting device of one embodiment of the present invention.

An example in which the lighting device according to one embodiment of the present invention is applied to an emergency exit light is illustrated in FIG. 8A.

FIG. 8A illustrates the appearance of an emergency exit light as an example. An emergency exit light 8232 can be formed by combination of the lighting device and a fluorescent plate provided with a fluorescent portion. Alternatively, the emergency exit light 8232 may be formed by combination of a lighting device which emits light of a specific color and a light-blocking plate provided with a transmissive portion with a shape illustrated in the drawing. The lighting device according to one embodiment of the present invention can emit light with a constant luminance, and thus is preferably used as an emergency exit light that needs to be on at all times.

Figure 8B:
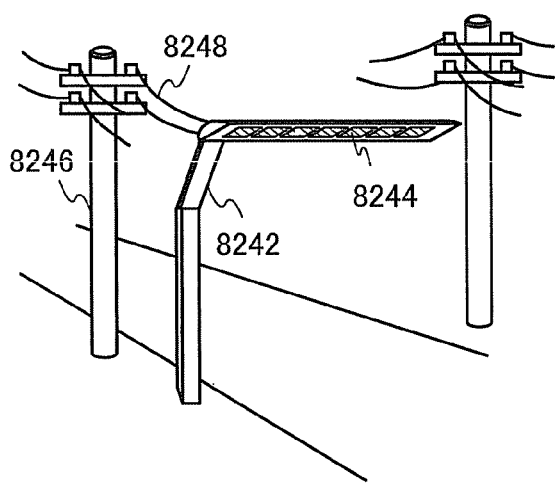

An example in which the lighting device according to one embodiment of the present invention is applied to an outdoor light is illustrated in FIG. 8B.

An example of the outdoor light is a streetlight. A streetlight can be formed by, for example, a housing 8242 and a lighting portion 8244 as illustrated in FIG. 8B. A plurality of lighting devices according to one embodiment of the present invention can be arranged in the lighting portion 8244. As illustrated in FIG. 8B, for example, the streetlight stands by the side of a road so that the lighting portion 8244 can illuminate the surroundings, whereby the visibility of the road and its surroundings can be improved.

In the case where a power source voltage is supplied to the streetlight, for example, it can be supplied through a power transmission line 8248 on a utility pole 8246 as illustrated in FIG. 8B. Note that the present invention is not limited to this case; for example, the housing 8242 may be provided with a photoelectric converter so that a voltage obtained from the photoelectric converter can be used as a power source voltage.

Figure 8C:
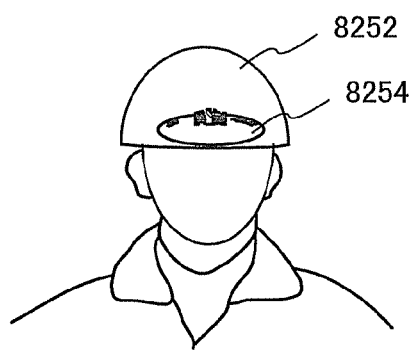
Figure 8D:
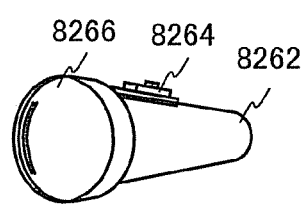

FIGS. 8C and 8D illustrate examples in which the lighting device according to one embodiment of the present invention is applied to a portable light. FIG. 8C illustrates a structure of a wearable light and FIG. 8D illustrates a structure of a handheld light.

The wearable light illustrated in FIG. 8C includes a mounting portion 8252 and a lighting portion 8254 fixed to the mounting portion 8252. The lighting device according to one embodiment of the present invention can be used for the lighting portion 8254. In the wearable light illustrated in FIG. 8C, the lighting portion 8254 can emit light while the mounting portion 8252 is put on the head. When a planar light source is used for the lighting portion 8254, the visibility of the surroundings can be improved. In addition, the lighting portion 8254 is lightweight, which makes it possible to reduce the load on the head on which the light is put.

Note that the structure of the wearable light is not limited to that illustrated in FIG. 8C, and for example, the following structure can be employed: the mounting portion 8252 is formed as a ring belt of flat braid or elastic braid, the lighting portion 8254 is fixed to the belt, and the belt is directly tied around the head.

The handheld light illustrated in FIG. 8D includes a housing 8262, a lighting portion 8266, and a switch 8264. The lighting device according to one embodiment of the present invention can be used for the lighting portion 8266. The use of the lighting device according to one embodiment of the present invention in the lighting portion 8266 reduces the thickness of the lighting portion 8266 and thus reduces the size of the light, which makes it easy for the light to be carried around.

The switch 8264 has a function of controlling emission or non-emission of the lighting portion 8266. The switch 8264 can also have a function of controlling, for example, the luminance of the lighting portion 8266 during light emission.

In the handheld light illustrated in FIG. 8D, the lighting portion 8266 is turned on with the switch 8264 so as to illuminate the surroundings, whereby the visibility of the surroundings can be improved. Furthermore, since the lighting device according to one embodiment of the present invention has a planar light source, the number of components like a light-reflecting plate can be reduced as compared with the case of using a point light source.

Note that this embodiment can be combined with any of the other embodiments as appropriate.

This application is based on Japanese Patent Application serial no. 2011-129020 filed with Japan Patent Office on Jun. 9, 2011, the entire contents of which are hereby incorporated by reference.

What is claimed is:

1. A lighting device comprising:
   a first substrate;
   an uneven region in the first substrate;
   a first electrode over the first substrate, the first substrate being surrounded by the uneven region;
   a first connection electrode over the first substrate, the uneven region, and the first electrode;
   a second connection electrode over the first substrate and the uneven region;
   a partition wall over the first electrode, the first connection electrode, and the second connection electrode;
   a light-emitting layer over the first electrode and the partition wall;
   a second electrode over the light-emitting layer, the partition wall, and the second connection electrode;
   a sealant over the uneven region, the first connection electrode, and the second connection electrode; and
   a second substrate over the sealant,
   wherein the uneven region is overlapped with the sealant,
   wherein the first connection electrode is electrically connected to the first electrode, and
   wherein the second connection electrode is electrically connected to the second electrode.

2. The lighting device according to claim 1, wherein the first connection electrode and the second connection electrode include conductive particles.

3. The lighting device according to claim 1, further comprising a microlens array substrate bonded to the first substrate.

4. A lighting device comprising:
   a first substrate;
   an uneven region in the first substrate;
   a planarizing layer over the uneven region;
   a first electrode over the planarizing layer;
   a first connection electrode over the first electrode, the planarizing layer, and the uneven region;
   a second connection electrode over the planarizing layer and the uneven region;
   a partition wall over the first electrode, the first connection electrode, and the second connection electrode;
   a light-emitting layer over the first electrode and the partition wall;
   a second electrode over the light-emitting layer, the partition wall, and the second connection electrode;
   a sealant over the uneven region, the first connection electrode, and the second connection electrode and surrounding the planarizing layer; and
   a second substrate over the sealant,
   wherein the first connection electrode is electrically connected to the first electrode, and
   wherein the second connection electrode is electrically connected to the second electrode.

5. The lighting device according to claim 4, wherein the uneven region is a depressed portion in the first substrate.

6. The lighting device according to claim 4, wherein the first connection electrode and the second connection electrode include conductive particles.

7. The lighting device according to claim 4, further comprising a microlens array substrate bonded to the first substrate.

8. A method for manufacturing a lighting device, comprising the steps of:
   forming an uneven region in a first substrate;
   forming a first electrode over the first electrode, the first electrode being surrounded by the uneven region;
   forming a first connection electrode over the first substrate, the uneven region, and the first electrode;
   forming a second connection electrode over the first substrate and the uneven region;
   forming a partition wall over the first substrate, the first electrode, the first connection electrode, and the second connection electrode;
   forming a light-emitting layer over the first electrode and the partition wall;
   forming a second electrode over the light-emitting layer, the partition wall, and the second connection electrode;
   applying a sealant over a second substrate; and
   attaching the first connection electrode, the second connection electrode, and the uneven region to the sealant to bond the first substrate and the second substrate, wherein the uneven region is overlapped with the sealant, wherein the first connection electrode is electrically connected to the first electrode, and wherein the second connection electrode is electrically connected to the second electrode.

9. The method for manufacturing the lighting device according to claim 8, wherein the uneven region is formed in the first substrate by any one of shotblasting, sandblasting, or chemical etching.

10. The method for manufacturing the lighting device according to claim 8, wherein the first connection electrode and the second connection electrode are formed with a conductive paste.

11. The method for manufacturing the lighting device according to claim 8, further comprising the step of bonding a microlens array substrate to the first substrate.

12. A method for manufacturing a lighting device, comprising the steps of:
   forming an uneven region in a first substrate;
   forming a planarizing layer over the uneven region;
   forming a first electrode over the planarizing layer;
   forming a first connection electrode over the uneven region, the planarizing layer, and the first electrode;
   forming a second connection electrode over the planarizing layer and the uneven region;
   forming a partition wall over the first electrode, the first connection electrode, and the second connection electrode;
   forming a light-emitting layer over the first electrode and the partition wall;
   forming a second electrode over the light-emitting layer, the partition wall, and the second connection electrode;
   applying a sealant over a second substrate; and
   attaching the first connection electrode, the second connection electrode, and the uneven region to the sealant to bond the first substrate and the second substrate,
   wherein the first connection electrode is electrically connected to the first electrode, and
   wherein the second connection electrode is electrically connected to the second electrode.

13. The method for manufacturing the lighting device according to claim 12, wherein the uneven region is formed in the first substrate by any one of shotblasting, sandblasting, or chemical etching.

14. The method for manufacturing the lighting device according to claim 12, wherein the first connection electrode and the second connection electrode are formed with a conductive paste.

15. The method for manufacturing the lighting device according to claim 12, further comprising the step of bonding a microlens array substrate to the first substrate.

* * * * *

UNITED STATES PATENT AND TRADEMARK OFFICE
CERTIFICATE OF CORRECTION

PATENT NO. : 8,698,190 B2
APPLICATION NO. : 13/490723
DATED : April 15, 2014
INVENTOR(S) : Kohei Yokoyama et al.

It is certified that error appears in the above-identified patent and that said Letters Patent is hereby corrected as shown below:

In the Specification:

Column 1, Line 56; Change "Patent. Document" to --Patent Document--.

Column 3, Line 9; Change "of substrate;" to --of a substrate;--.

Column 3, Line 25; Change "faulting" to --forming--.

Column 6, Line 14; Change "(faulted" to --(formed--.

Column 6, Line 25; Change "cycloolefm" to --cycloolefin--.

Column 7, Line 10; Change "fruited" to --formed--.

Column 7, Line 54; Change "Mimed" to --formed--.

Column 8, Line 60; Change "fainted" to --formed--.

Column 9, Line 33; Change "device. 100" to --device 100--.

Column 9, Line 45; Change "fanned" to --formed--.

Column 13, Line 44; Change ")-N-phenylamino]" to --)-N'-phenylamino]--.

Column 13, Line 52; Change "PCzPCN 1)." to --PCzPCN1).--.

Column 15, Line 55; Change "N,N,N,'N'-tetrakis" to --N,N,N',N'-tetrakis--.

Column 16, Line 10; Change "Ir(bzq$_3$);" to --Ir(bzq)$_3$);--.

Column 16, Line 45; Change "thenyl)-3,3;3-trifluoroacetonato]"
    to --thenoyl)-3,3,3-trifluoroacetonato]--.

Column 16, Line 67; Change "benzoxazo lyl)" to --benzoxazolyl)--.

Column 17, Lines 15 to 16; Change "(2-naphthyDanthracene" to --(2-naphthyl)anthracene--.

Column 17, Line 17; Change "3'-diphenanthrene" to --3'-diyl)diphenanthrene--.

Column 17, Line 19; Change "DPN2)," to --DPNS2),--.

Column 17, Line 35; Change "addition,. NPB," to --addition, NPB,--.

Signed and Sealed this
Twenty-sixth Day of August, 2014

Michelle K. Lee
*Deputy Director of the United States Patent and Trademark Office*

CERTIFICATE OF CORRECTION (continued)
U.S. Pat. No. 8,698,190 B2

In the Specification:

Column 18, Line 54; Change "second, light-emitting" to --second light-emitting--.

Column 19, Line 11; Change "uniform in light" to --uniform light--.

Column 20, Line 58; Change "foamed" to --formed--.

Column 21, Line 17; Change "light-emitting, layer 703," to --light-emitting layer 703,--.

Column 22, Line 38; Change "tin(III)" to --tin(II)--.

Column 22, Line 48; Change "thus; electrons" to --thus, electrons--.

Column 22, Line 57; Change "tin(III)" to --tin(IV)--.

Column 23, Line 14; Change "such ,a" to --such a--.